(12) United States Patent
Chiba (10) Patent No.: US 10,637,205 B2
(45) Date of Patent: Apr. 28, 2020

(54) LASER DEVICE (71) Applicant: FANUC CORPORATION, Yamanashi (JP)

(72) Inventor: Tetsuya Chiba, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/800,364

(22) Filed: Nov. 1, 2017

(65) Prior Publication Data

US 2018/0138654 A1    May 17, 2018

(30) Foreign Application Priority Data

Nov. 16, 2016   (JP) .................................. 2016-223307

(51) Int. Cl.
*H01S 3/13*      (2006.01)
*B23K 26/06*     (2014.01)
(Continued)

(52) U.S. Cl.
CPC .......... *H01S 3/1305* (2013.01); *B23K 26/032* (2013.01); *B23K 26/0626* (2013.01);
(Continued)

(58) Field of Classification Search
CPC ............. H01S 3/1022; H01S 3/094003; H01S 3/1305; H01S 5/02284; H01S 5/06825;
(Continued)

(56) References Cited

U.S. PATENT DOCUMENTS 3,936,631 A *  2/1976  Muska ..................... G02B 6/24
                                              250/227.24
4,165,496 A *  8/1979  Di Domenico, Jr. ........
                                              G02B 6/2817
                                              372/31
(Continued)

FOREIGN PATENT DOCUMENTS

CN          1574515 A      2/2005
CN        103222134 A      7/2013
(Continued)

OTHER PUBLICATIONS

An Office Action; "Notice of Reasons for Rejection," mailed by the Japanese Patent Office dated Feb. 27, 2018, which corresponds to Japanese Patent Application No. 2016-223307 and is related to U.S. Appl. No. 15/800,364.
(Continued)

*Primary Examiner* — Eric S Stapleton
(74) *Attorney, Agent, or Firm* — Studebaker & Brackett PC (57) ABSTRACT

To provide a laser device for adjusting a laser output by detecting the quantity of a reflected beam propagating within an optical fiber more accurately before an optical part is damaged due to an increase in quantity of the reflected beam. A laser device comprises: at least one first photodetector that detects the quantity of a reflected beam being part of a reflected beam returning to an optical fiber of the laser device after being reflected off of a work and propagating mainly through a cladding of the optical fiber; at least one second photodetector that detects the quantity of a reflected beam being part of the reflected beam returning to the optical fiber and propagating mainly through a core of the optical fiber; a power supply unit that supplies a driving current to a laser diode; and a control unit that controls the power supply unit. The control unit controls the driving current to
(Continued)

be supplied from the power supply unit to the laser diode in response to both an output from the first photodetector and an output from the second photodetector.

13 Claims, 5 Drawing Sheets

(51) Int. Cl.
<table>
<tr><td>B23K 26/38</td><td>(2014.01)</td></tr>
<tr><td>H01S 3/00</td><td>(2006.01)</td></tr>
<tr><td>H01S 3/067</td><td>(2006.01)</td></tr>
<tr><td>H01S 3/094</td><td>(2006.01)</td></tr>
<tr><td>H01S 3/0941</td><td>(2006.01)</td></tr>
<tr><td>H01S 3/10</td><td>(2006.01)</td></tr>
<tr><td>H01S 3/131</td><td>(2006.01)</td></tr>
<tr><td>H01S 3/102</td><td>(2006.01)</td></tr>
<tr><td>B23K 26/03</td><td>(2006.01)</td></tr>
<tr><td>H01S 5/068</td><td>(2006.01)</td></tr>
<tr><td>H01S 5/40</td><td>(2006.01)</td></tr>
<tr><td>H01S 5/022</td><td>(2006.01)</td></tr>
<tr><td>H01S 5/0683</td><td>(2006.01)</td></tr>
<tr><td>H01S 3/23</td><td>(2006.01)</td></tr>
</table>

(52) U.S. Cl.
CPC ........ *B23K 26/38* (2013.01); *H01S 3/094003* (2013.01); *H01S 3/1022* (2013.01); H01S 3/005 (2013.01); H01S 3/0007 (2013.01); H01S 3/0014 (2013.01); H01S 3/067 (2013.01); H01S 3/0941 (2013.01); H01S 3/10069 (2013.01); H01S 3/1312 (2013.01); H01S 3/2383 (2013.01); H01S 5/02284 (2013.01); H01S 5/0683 (2013.01); H01S 5/06825 (2013.01); H01S 5/4012 (2013.01)

(58) Field of Classification Search
CPC .... H01S 5/0683; H01S 5/4012; H01S 3/0007; H01S 3/005; H01S 3/067; H01S 3/0014; H01S 3/0941; H01S 3/1312; H01S 3/10069; H01S 3/2383; B23K 26/38; B23K 26/0626; B23K 26/032
USPC .................................................. 219/121.62
See application file for complete search history.

(56) References Cited

U.S. PATENT DOCUMENTS

<table>
<tr><td>4,317,981</td><td>A *</td><td>3/1982</td><td>Chubarov</td><td>B23K 9/10<br>219/121.3</td></tr>
<tr><td>4,371,897</td><td>A *</td><td>2/1983</td><td>Kramer</td><td>H04N 1/0281<br>250/227.31</td></tr>
<tr><td>4,466,697</td><td>A *</td><td>8/1984</td><td>Daniel</td><td>A47G 19/16<br>385/123</td></tr>
<tr><td>4,475,789</td><td>A *</td><td>10/1984</td><td>Kahn</td><td>G02B 6/2852<br>385/48</td></tr>
<tr><td>4,618,211</td><td>A *</td><td>10/1986</td><td>Fleury, V</td><td>G02B 6/02<br>385/123</td></tr>
<tr><td>4,618,212</td><td>A *</td><td>10/1986</td><td>Ludington</td><td>G02B 6/2551<br>356/73.1</td></tr>
<tr><td>4,652,143</td><td>A *</td><td>3/1987</td><td>Wickersheim</td><td>G01K 11/3213<br>250/458.1</td></tr>
<tr><td>4,698,692</td><td>A *</td><td>10/1987</td><td>Fry</td><td>G02F 1/113<br>219/121.67</td></tr>
<tr><td>4,716,288</td><td>A *</td><td>12/1987</td><td>Doi</td><td>A61B 1/00055<br>250/227.11</td></tr>
<tr><td>4,781,428</td><td>A *</td><td>11/1988</td><td>Epworth</td><td>G02B 6/02071<br>359/900</td></tr>
<tr><td>4,789,992</td><td>A *</td><td>12/1988</td><td>Wickersheim</td><td>G01K 11/3213<br>250/458.1</td></tr>
<tr><td>4,812,641</td><td>A *</td><td>3/1989</td><td>Ortiz, Jr.</td><td>G01M 11/35<br>219/121.62</td></tr>
<tr><td>4,816,687</td><td>A *</td><td>3/1989</td><td>Fehrenbach</td><td>C09K 11/676<br>250/459.1</td></tr>
<tr><td>4,834,533</td><td>A *</td><td>5/1989</td><td>Horike</td><td>G01N 21/431<br>250/227.23</td></tr>
<tr><td>4,848,999</td><td>A *</td><td>7/1989</td><td>Taylor</td><td>G02B 6/02052<br>65/407</td></tr>
<tr><td>4,883,054</td><td>A *</td><td>11/1989</td><td>Fuller</td><td>G01M 11/31<br>606/12</td></tr>
<tr><td>4,887,879</td><td>A *</td><td>12/1989</td><td>Prucnal</td><td>G02B 6/14<br>385/48</td></tr>
<tr><td>4,923,273</td><td>A *</td><td>5/1990</td><td>Taylor</td><td>G02B 6/02052<br>359/245</td></tr>
<tr><td>4,936,649</td><td>A *</td><td>6/1990</td><td>Lymer</td><td>G01M 5/0091<br>156/158</td></tr>
<tr><td>4,937,422</td><td>A *</td><td>6/1990</td><td>Nagamine</td><td>G05B 19/404<br>219/121.61</td></tr>
<tr><td>5,012,087</td><td>A *</td><td>4/1991</td><td>Rockstroh</td><td>G01M 11/33<br>250/227.15</td></tr>
<tr><td>5,080,506</td><td>A *</td><td>1/1992</td><td>Campbell</td><td>G02B 6/4201<br>385/29</td></tr>
<tr><td>5,107,445</td><td>A *</td><td>4/1992</td><td>Jensen</td><td>G01K 11/3213<br>374/161</td></tr>
<tr><td>5,159,402</td><td>A *</td><td>10/1992</td><td>Ortiz, Jr.</td><td>H01S 3/1312<br>356/237.1</td></tr>
<tr><td>5,179,275</td><td>A *</td><td>1/1993</td><td>Lieber</td><td>G01M 11/35<br>250/227.24</td></tr>
<tr><td>5,206,455</td><td>A *</td><td>4/1993</td><td>Williams</td><td>F42B 3/113<br>102/201</td></tr>
<tr><td>5,219,345</td><td>A *</td><td>6/1993</td><td>Potter</td><td>A61B 1/00165<br>250/227.11</td></tr>
<tr><td>5,251,001</td><td>A *</td><td>10/1993</td><td>Dave</td><td>H04B 10/071<br>250/227.11</td></tr>
<tr><td>5,278,932</td><td>A *</td><td>1/1994</td><td>DeVeau, Jr.</td><td>G01M 11/35<br>250/227.24</td></tr>
<tr><td>5,315,365</td><td>A *</td><td>5/1994</td><td>Hakimi</td><td>G01M 11/35<br>356/73.1</td></tr>
<tr><td>5,319,195</td><td>A *</td><td>6/1994</td><td>Jones</td><td>B23K 26/032<br>219/121.62</td></tr>
<tr><td>5,359,192</td><td>A *</td><td>10/1994</td><td>Williams</td><td>F42B 3/113<br>250/226</td></tr>
<tr><td>5,360,960</td><td>A *</td><td>11/1994</td><td>Shirk</td><td>B23K 26/032<br>219/121.63</td></tr>
<tr><td>5,414,266</td><td>A *</td><td>5/1995</td><td>Sun</td><td>G01K 11/3213<br>250/458.1</td></tr>
<tr><td>5,470,155</td><td>A *</td><td>11/1995</td><td>Jensen</td><td>G01K 11/3213<br>250/459.1</td></tr>
<tr><td>5,600,147</td><td>A *</td><td>2/1997</td><td>Jensen</td><td>G01K 11/3213<br>250/458.1</td></tr>
<tr><td>5,712,937</td><td>A *</td><td>1/1998</td><td>Asawa</td><td>G02B 6/12007<br>385/12</td></tr>
<tr><td>5,841,099</td><td>A *</td><td>11/1998</td><td>Owen</td><td>C23C 14/046<br>219/121.69</td></tr>
<tr><td>5,966,206</td><td>A *</td><td>10/1999</td><td>Jander</td><td>H04B 10/071<br>356/73.1</td></tr>
<tr><td>6,041,070</td><td>A *</td><td>3/2000</td><td>Koch</td><td>H01S 3/0675<br>372/102</td></tr>
<tr><td>6,046,802</td><td>A *</td><td>4/2000</td><td>Ortiz, Jr.</td><td>G01N 21/958<br>356/237.1</td></tr>
<tr><td>6,218,642</td><td>B1 *</td><td>4/2001</td><td>Christmas</td><td>C21D 1/09<br>219/121.66</td></tr>
<tr><td>6,275,516</td><td>B1 *</td><td>8/2001</td><td>Arney</td><td>H01S 5/4025<br>372/71</td></tr>
<tr><td>6,337,939</td><td>B1 *</td><td>1/2002</td><td>Aspell</td><td>H01S 5/0687<br>372/6</td></tr>
<tr><td>6,355,905</td><td>B1 *</td><td>3/2002</td><td>Sasaki</td><td>H01S 3/102<br>219/121.62</td></tr>
<tr><td>6,389,186</td><td>B1 *</td><td>5/2002</td><td>DiGiovanni</td><td>H01S 3/0014<br>372/6</td></tr>
<tr><td>6,424,663</td><td>B1 *</td><td>7/2002</td><td>Fidric</td><td>H01S 3/1301<br>372/6</td></tr>
<tr><td>6,481,903</td><td>B1 *</td><td>11/2002</td><td>Varma</td><td>G02B 6/2558<br>385/95</td></tr>
<tr><td>6,513,994</td><td>B1 *</td><td>2/2003</td><td>DiGiovanni</td><td>G01N 21/896<br>356/73.1</td></tr>
</table>

(56) References Cited

U.S. PATENT DOCUMENTS

| | | | | |
|---|---|---|---|---|
| 6,528,761 B1* | 3/2003 | Roos | B23K 26/04 | 219/121.73 |
| 6,549,687 B1* | 4/2003 | Kochergin | G02B 26/001 | 250/227.27 |
| 6,687,445 B2* | 2/2004 | Carter | C03B 37/01294 | 385/127 |
| 6,741,081 B1* | 5/2004 | Eslambolchi | H04B 10/07 | 324/509 |
| 6,829,286 B1* | 12/2004 | Guilfoyle | G02B 6/34 | 372/108 |
| 6,924,474 B2* | 8/2005 | Kato | G01J 1/18 | 250/227.11 |
| 6,932,809 B2* | 8/2005 | Sinofsky | A61B 18/20 | 606/12 |
| 6,937,329 B2* | 8/2005 | Esmiller | B23K 1/0056 | 219/121.63 |
| 7,058,267 B2* | 6/2006 | Neuhaus | G02B 6/2552 | 250/573 |
| 7,088,437 B2* | 8/2006 | Blomster | G01M 11/35 | 356/73.1 |
| 7,146,073 B2* | 12/2006 | Wan | B23K 26/03 | 385/29 |
| 7,283,242 B2* | 10/2007 | Thornton | A61B 5/14532 | 356/432 |
| 7,371,019 B2* | 5/2008 | Seifert | G01M 11/37 | 385/95 |
| 7,437,046 B2* | 10/2008 | DiGiovanni | G02B 6/0365 | 385/126 |
| 7,535,944 B1* | 5/2009 | Guilfoyle | G02B 6/4214 | 372/108 |
| 7,633,621 B2* | 12/2009 | Thornton | A61B 5/14532 | 356/432 |
| 7,711,220 B2* | 5/2010 | Scofet | G02B 6/4206 | 385/27 |
| 7,787,504 B2* | 8/2010 | Leggett | H01S 5/06825 | 372/29.02 |
| 7,869,016 B2* | 1/2011 | Mitchell | A61B 18/22 | 356/73.1 |
| 7,925,126 B2* | 4/2011 | Chow | G01D 5/35383 | 370/223 |
| 7,957,438 B2* | 6/2011 | Simons | G02B 6/4206 | 372/29.01 |
| 8,027,555 B1* | 9/2011 | Kliner | G02B 6/2852 | 385/29 |
| 8,150,261 B2* | 4/2012 | Tzeng | G08C 17/02 | 385/88 |
| 8,420,977 B2* | 4/2013 | Bradley | F41G 7/224 | 219/121.67 |
| 8,452,147 B2* | 5/2013 | Avdokhin | H01S 3/0014 | 372/6 |
| 8,695,430 B1* | 4/2014 | Eldridge | G01L 11/02 | 73/700 |
| 8,811,434 B2* | 8/2014 | Miyato | H01S 3/0014 | 372/6 |
| 8,988,669 B2* | 3/2015 | Liao | G01J 1/4257 | 356/73.1 |
| 9,134,171 B2* | 9/2015 | Blomster | G01J 1/4257 | |
| 9,267,330 B2* | 2/2016 | Rinzler | E21B 7/14 | |
| 9,429,467 B2* | 8/2016 | Guimond | G01J 1/0295 | |
| 10,180,539 B2* | 1/2019 | Isenhour | G02B 6/3817 | |
| 2002/0003130 A1* | 1/2002 | Sun | B23K 26/04 | 219/121.68 |
| 2002/0197027 A1* | 12/2002 | Saito | G02B 6/255 | 385/96 |
| 2004/0091011 A1* | 5/2004 | Liu | B82Y 20/00 | 372/50.11 |
| 2004/0202400 A1* | 10/2004 | Kochergin | G01D 5/35316 | 385/12 |
| 2005/0002607 A1* | 1/2005 | Neuhaus | G02B 6/2552 | 385/31 |
| 2005/0025418 A1* | 2/2005 | Brown | G02B 6/4296 | 385/31 |
| 2006/0013532 A1* | 1/2006 | Wan | B23K 26/03 | 385/31 |
| 2006/0165343 A1* | 7/2006 | Seifert | G01M 11/37 | 385/12 |
| 2006/0219676 A1* | 10/2006 | Taylor | B82Y 20/00 | 219/121.69 |
| 2007/0036499 A1* | 2/2007 | Shukunami | G02B 6/2551 | 385/128 |
| 2007/0158315 A1* | 7/2007 | Tanaka | B23K 26/0604 | 219/121.8 |
| 2007/0230517 A1* | 10/2007 | Matsuda | B23K 26/0643 | 372/6 |
| 2008/0043796 A1* | 2/2008 | Jikutani | B82Y 20/00 | 372/50.11 |
| 2008/0173392 A1* | 7/2008 | Tanaka | B23K 26/0604 | 156/272.8 |
| 2008/0245778 A1* | 10/2008 | D'Angelo | B23K 26/032 | 219/121.64 |
| 2009/0159579 A1* | 6/2009 | Nishio | B23K 26/03 | 219/121.63 |
| 2009/0302012 A1* | 12/2009 | Ota | B23K 26/0626 | 219/121.64 |
| 2011/0157593 A1* | 6/2011 | Miyadera | G01N 21/553 | 356/445 |
| 2011/0181929 A1* | 7/2011 | Matsumoto | B23K 26/0643 | 359/15 |
| 2014/0168655 A1* | 6/2014 | Qiu | G01C 19/721 | 356/460 |
| 2014/0241385 A1 | 8/2014 | Fomin et al. | | |
| 2014/0241663 A1 | 8/2014 | Fomin et al. | | |
| 2015/0021303 A1* | 1/2015 | Funaki | B23K 26/08 | 219/121.62 |
| 2015/0086220 A1* | 3/2015 | Warren | H04B 10/503 | 398/200 |

FOREIGN PATENT DOCUMENTS

| | | |
|---|---|---|
| CN | 204621354 U | 9/2015 |
| JP | 2000-314673 A | 11/2000 |
| JP | 2007-42981 A | 2/2007 |
| JP | 4699131 B2 | 6/2011 |
| JP | 5789527 B2 | 10/2015 |
| WO | 2012/036664 A1 | 3/2012 |
| WO | 2016/002947 A1 | 1/2016 |

OTHER PUBLICATIONS

An Office Action mailed by the State Intellectual Property Office of the People's Republic of China dated Dec. 7, 2018, which corresponds to Chinese Patent Application No. 201711122917.9 and is related to U.S. Appl. No. 15/800,364.

An Office Action mailed by the German Patent Office dated Mar. 12, 2019, which corresponds to German Patent Application No. 10 2017 220 254.8 and is related to U.S. Appl. No. 15/800,364.

* cited by examiner

LASER DEVICE

This application is based on and claims the benefit of priority from Japanese Patent Application No. 2016-223307, filed on 16 Nov. 2016, the content of which is incorporated herein by reference.

BACKGROUND OF THE INVENTION

Field of the Invention

The present invention relates to a laser device that outputs a laser beam by means of transmission through an optical fiber and detects a reflected beam.

Related Art

A fiber laser device used as a laser machine for cutting of sheet metal or welding includes an optical fiber propagation unit for propagation of a laser beam within an optical fiber. In this fiber laser device, a reflected beam reflected off of a work may return to the laser device to cause risk of damage to an optical part such as the optical fiber or a laser diode (LD) due to unintentional heating, for example. In the worst case, the optical part may break. Hence, detecting the quantity of the reflected beam accurately and using the detected quantity as a feedback for control over a laser beam output has been required.

In this regard, patent document 1 discloses the following technique relating to an optical fiber laser. An optical coupler includes a monitor port for propagation of part of a return beam traveling from an optical fiber toward an excitation beam source. If the intensity of the return beam exceeds a predetermined value, the output of the excitation beam source is reduced.

According to a technique disclosed in patent document 2, the intensity of a beam leaking from a side surface of an optical fiber is detected, and the operation of a laser machine is controlled by using a result of a comparison between the detected beam intensity and a threshold.

Patent Document 1: Japanese Patent No. 4699131
Patent Document 2: Japanese Patent No. 5789527

SUMMARY OF THE INVENTION

An optical fiber has a two-layer structure mainly including a core as a center core of the optical fiber and a cladding that is external to the core and surrounding the core. Alternatively, the cladding has two layers including a first cladding and a second cladding covering the outer periphery of the first cladding. The optical fiber as a whole has a three-layer structure including the core, the first cladding, and the second cladding. A reflected beam reflected off of a work described above includes a reflected beam to propagate through the core and a reflected beam to propagate through the cladding. In some cases, even if the quantity of the reflected beam propagating mainly through the core is small, the reflected beam propagating mainly through the cladding can burn the fiber, a protective coating for the fiber, and the like. Conversely, in some cases, even if the quantity of the reflected beam propagating mainly through the cladding is small, the reflected beam propagating mainly through the core can damage an optical part such as a laser diode (LD).

In this regard, the above-described invention according to patent document 1 is to detect only a reflected beam propagating through the core. Further, the invention according to patent document 2 is to detect only a reflected beam propagating through the cladding. Specifically, the inventions according to patent document 1 and patent document 2 are not available for detecting the quantity of a reflected beam accurately reflected off the work.

The present invention is intended to provide a laser device for adjusting a laser output by detecting the quantity of a reflected beam propagating within an optical fiber more accurately before an optical part is damaged due to an increase in quantity of the reflected beam.

(1) A laser device (laser device 10, 20, 30 described later, for example) according to the present invention outputs a laser beam by means of transmission through an optical fiber (optical fiber 100 described later, for example) using a laser diode (laser diode 120 described later, for example) as a laser beam source or an excitation beam source. The laser device comprises: at least one first photodetector (first photodetector 160 described later, for example) that detects the quantity of a reflected beam being part of a reflected beam returning to the optical fiber of the laser device after being reflected off of a work (work 50 described later, for example) and propagating mainly through a cladding of the optical fiber; at least one second photodetector (second photodetector 170 described later, for example) that detects the quantity of a reflected beam being part of the reflected beam returning to the optical fiber and propagating mainly through a core of the optical fiber; a power supply unit (power supply unit 130 described later, for example) that supplies a driving current to the laser diode; and a control unit (control unit 140 described later, for example) that controls the power supply unit. The control unit controls the power supply unit in response to both an output from the first photodetector and an output from the second photodetector.

(2) In the laser device described in (1), at least one predetermined threshold may be set for at least one of the quantity of the reflected beam detected by the first photodetector (first photodetector 160 described later, for example) and the quantity of the reflected beam detected by the second photodetector (second photodetector 170 described later, for example). If at least one of the quantity of the reflected beam detected by the first photodetector and the quantity of the reflected beam detected by the second photodetector exceeds the corresponding predetermined threshold, the control unit (control unit 140 described later, for example) may control the driving current to be supplied from the power supply unit (power supply unit 130 described later, for example) to the laser diode (laser diode 120 described later, for example), thereby changing a laser beam output from the laser device (laser device 10, 20, 30 described later, for example).

(3) In the laser device described in (1) or (2), at least one predetermined threshold may be set for a quantity P of a reflected beam calculated as $P=k_1 \times P(1)+k_2 \times P(2)$ ($k_1$ and $k_2$ are positive real numbers) where $P(1)$ is the quantity of the reflected beam detected by the first photodetector (first photodetector 160 described later, for example) and $P(2)$ is the quantity of the reflected beam detected by the second photodetector (second photodetector 170 described later, for example). If the quantity P of the reflected beam exceeds the corresponding predetermined threshold, the control unit (control unit 140 described later, for example) may control the driving current to be supplied from the power supply unit (power supply unit 130 described later, for example) to the laser diode (laser diode 120 described later, for example), thereby changing a laser beam output from the laser device (laser device 10, 20, 30 described later, for example).

(4) In the laser device described in (1) to (3), a series of operations comprising detection of the quantity of the reflected beam by the first photodetector (first photodetector 160 described later, for example), detection of the quantity of the reflected beam by the second photodetector (second photodetector 170 described later, for example), a determination as to whether or not the detected beam quantity exceeds the corresponding predetermined threshold, and change of a laser beam output from the laser device (laser device 10, 20, 30 described later, for example) in response to excess of the detected beam quantity over the corresponding threshold may be performed at a time interval of 100 nsec to 10 msec.

(5) In the laser device described in (1) to (4), the beam quantity detected by at least one of the first photodetector (first photodetector 160 described later, for example) and the second photodetector (second photodetector 170 described later, for example) may include a contribution by the quantity of a laser beam output in response to a beam output command from the control unit (control unit 140 described later, for example) and traveling in a forward direction substantially opposite to a direction in which the reflected beam travels. The control unit may determine the quantity of the reflected beam by subtracting the contribution by the quantity of the laser beam traveling in the forward direction from the beam quantity detected by the at least one photodetector.

(6) In the laser device described in (1) to (5), at least one of the first photodetector (first photodetector 160 described later, for example) and the second photodetector (second photodetector 170 described later, for example) may further function as an output beam detector that detects the quantity of the laser beam traveling in the forward direction.

(7) in the laser device described in (1) to (6), the first photodetector (first photodetector 160 described later, for example) may be arranged so as to detect a beam leaking from the cladding of the optical fiber.

(8) In the laser device described in (7), the first photodetector (first photodetector 160 described later, for example) may be provided near a connection (connection 105 described later, for example) formed of a fused part of the optical fiber.

(9) In the laser device described in (1) to (8), the second photodetector (second photodetector 170 described later, for example) may be arranged at a terminal of each of multiple optical fibers resulting from branching of the optical fiber.

(10) In the laser device described in (1) to (9), in the absence of a reflected beam from the work (work 50 described later, for example), actual beam output characteristics responsive to a beam output command from the control unit (control unit 140 described later, for example) and at least one of the beam quantity detected by the first photodetector (first photodetector 160 described later, for example) and the beam quantity detected by the second photodetector (second photodetector 170 described later, for example) may be measured by following a predetermined schedule. Resultant measurement data may be stored in the control unit or a storage unit to be referenced by the control unit, or data stored in the control unit or the storage unit may be updated using the measurement data.

(11) In the laser device described in (1) to (10), at least one of the first photodetector (first photodetector 160 described later, for example) and the second photodetector (second photodetector 170 described later, for example) may be provided at a cutting head (cutting head 15 described later, for example).

(12) In the laser device described in (1) to (11), at least one of the first photodetector (first photodetector 160 described later, for example) and the second photodetector (second photodetector 170 described later, for example) may be a photodiode.

(13) In the laser device described in (1) to (11), at least one reflected beam detector from the first photodetector (first photodetector 160 described later, for example) and the second photodetector (second photodetector 170 described later, for example) may be a fiber temperature sensor.

(14) The laser device (laser device 10, 20, 30 described later, for example) described in (1) to (13) may further comprise a photodetector temperature sensor that detects the temperature of at least one of the first photodetector (first photodetector 160 described later, for example) and the second photodetector (second photodetector 170 described later, for example).

(15) In the laser device described in (1) to (14), at least one of the first photodetector (first photodetector 160 described later, for example) and the second photodetector (second photodetector 170 described later, for example) may include multiple photodetectors. If there is a difference in the detected quantity of the reflected beam between the multiple first photodetectors or between the multiple second photodetectors, the control unit (control unit 140 described later, for example) may control the driving current to be supplied from the power supply unit (power supply unit 130 described later, for example) to the laser diode (laser diode 120 described later, for example) based on a maximum beam quantity.

The present invention is capable of providing a laser device for adjusting a laser output by detecting the quantity of a reflected beam propagating within an optical fiber more accurately before an optical part is damaged due to an increase in quantity of the reflected beam.

DETAILED DESCRIPTION OF THE INVENTION

Embodiments of the present invention will be described in detail below by referring to FIGS. 1 to 5.

First Embodiment

Figure 1:
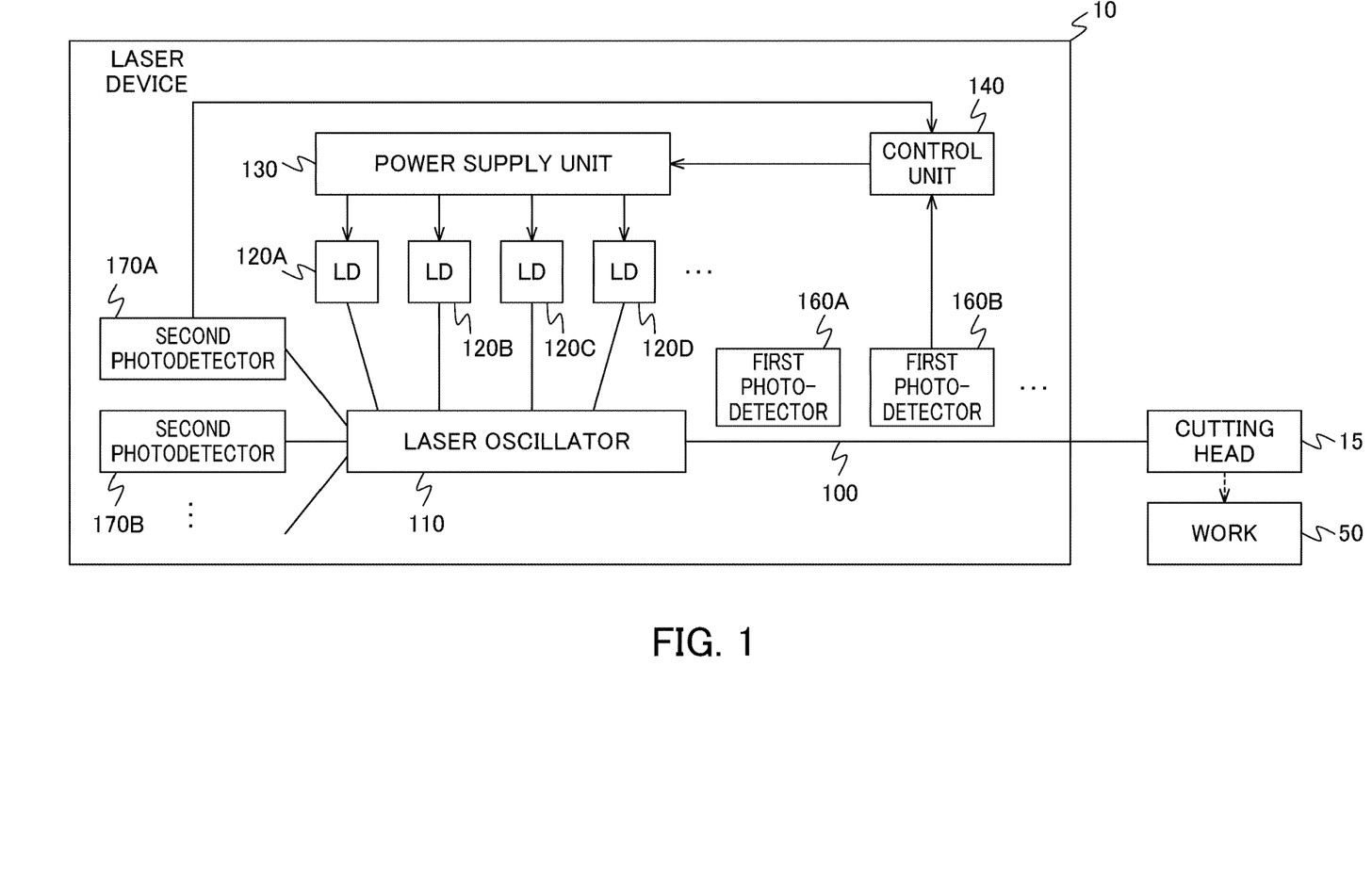
FIG. 1 shows the configuration of a laser device according to a first embodiment of the present invention.

As shown in FIG. 1, a laser device 10 according to a first embodiment of the present invention includes: a laser oscillator 110 that produces oscillation of a laser through an optical fiber 100; a laser diode (LD) 120A, a laser diode 120B, a laser diode 120C, and a laser diode 120D (they will collectively be called a laser diode 120)) optically connected to the laser oscillator 110 and each functioning as a source for the laser oscillated by the laser oscillator 110 or an excitation beam source; a power supply unit 130 that supplies a driving current to the laser diode 120; and a control unit 140 that controls the power supply unit 130. The laser output from the laser oscillator 110 propagates through the optical fiber 100, passes through a cutting head 15, and is then applied to a work 50 as a cutting target. Part of this laser is reflected off the work 50 and a resultant reflected beam passes through the cutting head 15 and is then input to the optical fiber 100. The laser device 10 further includes a first photodetector 160A and a first photodetector 160B (they will collectively be called a first photodetector 160) that detect part of this reflected beam propagating mainly through a cladding of the optical fiber 100, and a second photodetector 170A and a second photodetector 170B (they will collectively be called a second photodetector 170) that detect part of this reflected beam propagating mainly through a core of the optical fiber 100. The first photodetector 160 transmits a first detection signal to the control unit 140 indicating the quantity of the reflected beam propagating mainly through the cladding of the optical fiber 100. The second photodetector 170 transmits a second detection signal to the control unit 140 indicating the quantity of the reflected beam propagating mainly through the core of the optical fiber 100. The control unit 140 controls the supply or the driving current to the laser diode 120 by the power supply unit 130 based on at least one of the first detection signal and the second detection signal.

Figure 2A:
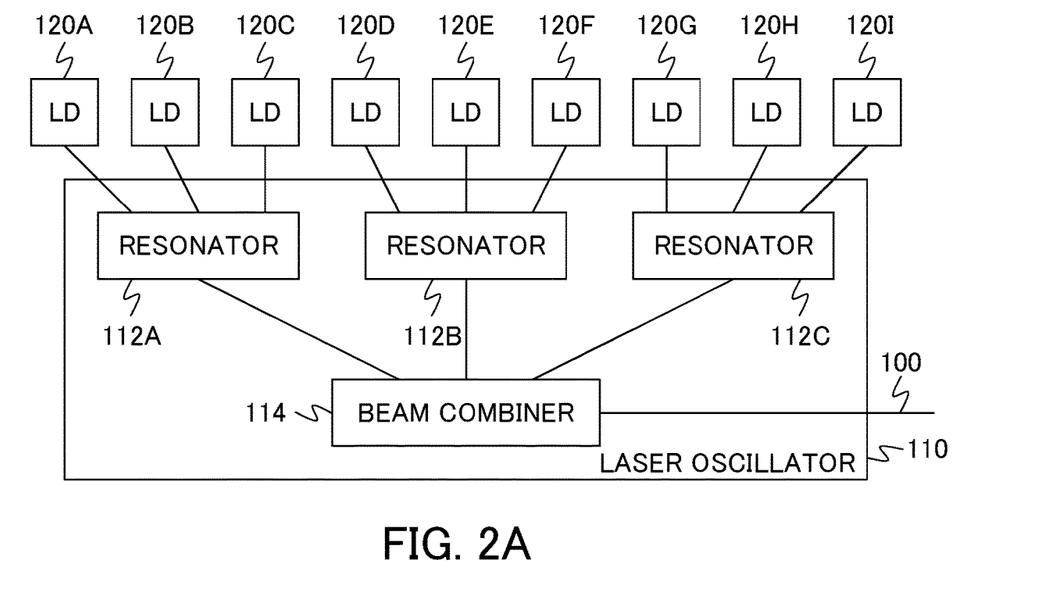
FIG. 2A shows the configuration of a laser oscillator according to the first embodiment of the present invention.
Figure 2B:
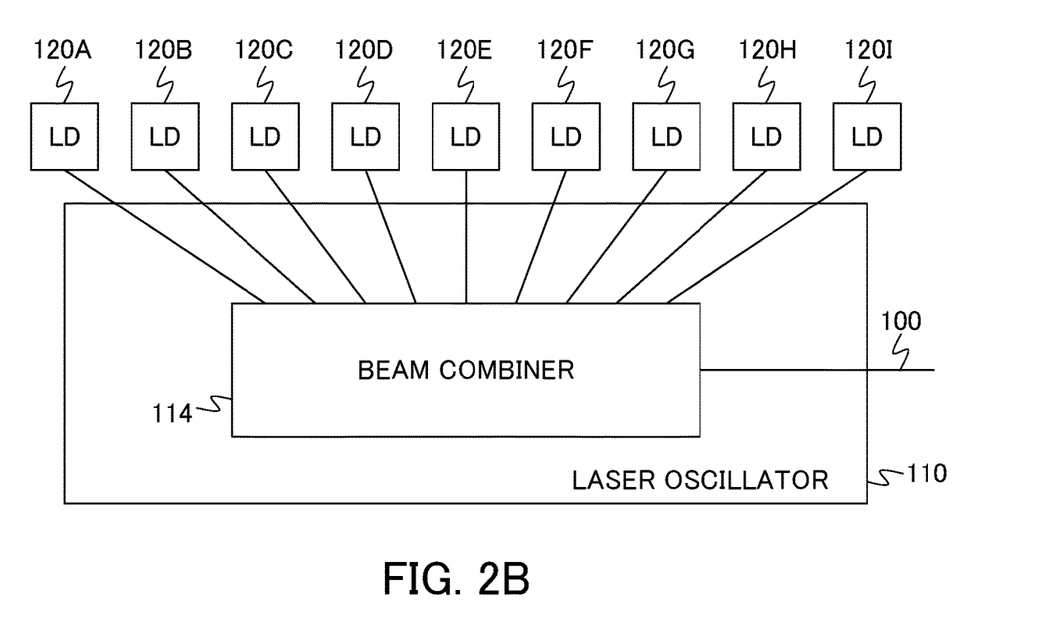
FIG. 2B shows the configuration of a laser oscillator according to the first embodiment of the present invention.

FIGS. 2A and 2B each show an example of the configuration of the laser oscillator 110. As shown in FIG. 2A, the laser oscillator 110 may be a fiber laser including a resonator 112A, a resonator 112B, and a resonator 112C each connected to the multiple laser diodes 120 functioning as excitation beam sources (they will collectively be called a resonator 112. The number of the resonators 112 can be set freely.) This fiber laser may further include a beam combiner 114 connected to the resonator 112. Alternatively, as shown in FIG. 2B, the laser oscillator 110 may be a direct diode laser including the beam combiner 114 directly connected to the multiple laser diodes 120 functioning as laser beam sources. The resonator 112 may be formed of a laser medium that emits a beam by itself in response to receipt of a beam from the excitation beam source, and a resonant mirror that causes reflection of the beam emitted from the laser medium by itself and causes the reflected beam to return to the laser medium. The beam combiner 114 means an optical coupler that combines laser beams received from the multiple resonators 112 or the multiple laser diodes 120 into one beam.

FIG. 1 shows four laser diodes 120. However, this is not the only possible number of the laser diodes 120. Likewise, while FIGS. 2A and 2B each show nine laser diodes 120, this is not the only possible number of the laser diodes 120.

At least one of the first photodetector 160 and the second photodetector 170 may be a photodiode, to which the present invention is not limited. Alternatively, at least one of the first photodetector 160 and the second photodetector 170 may be a fiber temperature sensor and a sensed temperature may be transmitted as a feedback to the control unit 140 so as to avoid a temperature increase of the optical fiber 100 to a degree that causes burning of the optical fiber 100, although the present invention is not limited to this. The first photodetector 160 may be arranged so as to detect a beam leaking from the cladding of the optical fiber 100, to which the present invention is not limited. The optical fiber 100 may be branched into multiple optical fibers within the laser oscillator 110 and the second photodetector 170 may be arranged at a terminal of each of the branches, although the present invention is not limited to this. Additionally, while FIG. 1 shows two first photodetectors 160 and two second photodetectors 170, this is not the only possible number and the number of the first photodetectors 160 and that of the second photodetectors 170 can be set freely.

Next, the operation of the laser device 10 will be described in detail by referring to the flowchart of FIG. 3.

In step S11, the first photodetector 160 detects the quantity of a reflected beam being part of a reflected beam from the work 50 and propagating mainly through the cladding of the optical fiber 100. The detected quantity of this beam will be called P(1) below. Further, the first photodetector 160 transmits a first detection signal to the control unit 140 indicating the detected beam quantity.

In step S12, the second photodetector 170 detects the quantity of a reflected beam being part of the reflected beam from the work 50 and propagating mainly through the core of the optical fiber 100. The detected quantity of this reflected beam will be called P(2) below. Further, the second photodetector 170 transmits a second detection signal to the control unit 140 indicating the detected beam quantity.

In step S13, the control unit 140 compares P(1) with a first threshold. If P(1) is equal to or greater than the first threshold (S13: YES), the control unit 140 proceeds to step S15. If P(1) is less than the first threshold (S13: NO), the control unit 140 proceeds to step S14.

In step S14, the control unit 140 compares P(2) with a second threshold. If P(2) is equal to or greater than the second threshold (S14: YES), the control unit 140 proceeds to step S15. If P(2) is less than the second threshold (S14: NO), the control unit 140 returns to step S11 (RETURN) without taking any action.

In step S15, the control unit 140 controls the supply of the driving current to the laser diode 120 by the power supply unit 130. More specifically, the control unit 140 exerts feedback control over the supply of the driving current to the laser diode 120 so as to reduce the quantity of the reflected beam sufficiently for avoiding damage to an optical part in the laser diode 120. Then, the control unit 140 returns to step S11 (RETURN).

The above-described operation from step S11 to step S15 is preferably performed at a time interval of 100 nsec to 10 msec, to which the present invention is not limited.

If there are multiple first photodetectors 160 and if there is a difference in the detected quantity of the reflected beam between the multiple first photodetectors 160, a maximum detected value may be used as P(1) described above, to which the present invention is not limited. Likewise, if there are multiple second photodetectors 170 and if there is a difference in the detected quantity of the reflected beam between the multiple second photodetectors 170, a maximum detected value may be used as P(2) described above, to which the present invention is not limited.

[Effect Achieved by First Embodiment]

The state of input of a reflected beam to the laser device changes in a manner that depends on a condition for output of a laser beam or the state of the work. With the above-described configuration, even if the reflected beam is input to both the cladding and the core of the optical fiber, the quantity of the reflected beam propagating through the cladding and that of the reflected beam propagating through the core can be detected accurately. Further, the total quantity of the reflected beam returning to the optical fiber can be calculated. This makes it possible to monitor the quantity of the reflected beam more accurately.

Even if a reflected beam is input to both the cladding and the core of the optical fiber, feedback control over a laser beam output (including a pulsed beam output) is exerted before the laser device is damaged. In this way, damage to the laser device can be prevented reliably.

If the operation from detection of a reflected beam to feedback control over a laser beam output is performed at a time interval of 100 nsec to 10 msec, the laser device can be protected from the reflected beam more effectively by operating at such high speeds, thereby minimizing damage.

If the first photodetector is arranged so as to detect a beam leaking from the cladding of the optical fiber, a reflected beam propagating through the cladding can be detected with a simple structure.

If the second photodetector is arranged at a terminal of each of multiple optical fibers resulting from branching of the optical fiber, the quantity of a reflected beam propagating through the core can be detected with a high degree of accuracy.

If at least one reflected beam detector from the first photodetector and the second photodetector is a photodiode, using the photodiode having high responsiveness makes it possible to prevent damage to the laser device more effectively.

If at least one reflected beam detector from the first photodetector and the second photodetector is a fiber temperature sensor, feedback control is exerted so as to avoid a temperature increase of the fiber to a degree that causes burning of the fiber. This makes it possible to prevent damage to the laser device more effectively.

If at least one reflected beam detector from the first photodetector and the second photodetector includes multiple reflected beam detectors, damage to the laser device can be prevented even if some of the reflected beam detectors malfunction.

Second Embodiment

The configuration of a laser device 20 according to a second embodiment of the present invention is basically the same as that of the laser device 10 according to the first embodiment. Thus, the illustration of the laser device 20 in the drawings and the description of the laser device 20 will be omitted. Unlike in the laser device 10 of the first embodiment, however, in the laser device 20 of the second embodiment, instead of comparing the quantity P(1) of a reflected beam detected by the first photodetector 160 with the first threshold and comparing the quantity P(2) of a reflected beam detected by the second photodetector 170 with the second threshold, a quantity P of an entire reflected beam is calculated based on P(1) and P(2), and the calculated P is compared with a threshold. The operation of the laser device 20 will be described in detail by referring to the flowchart of FIG. 4.

Figure 4:
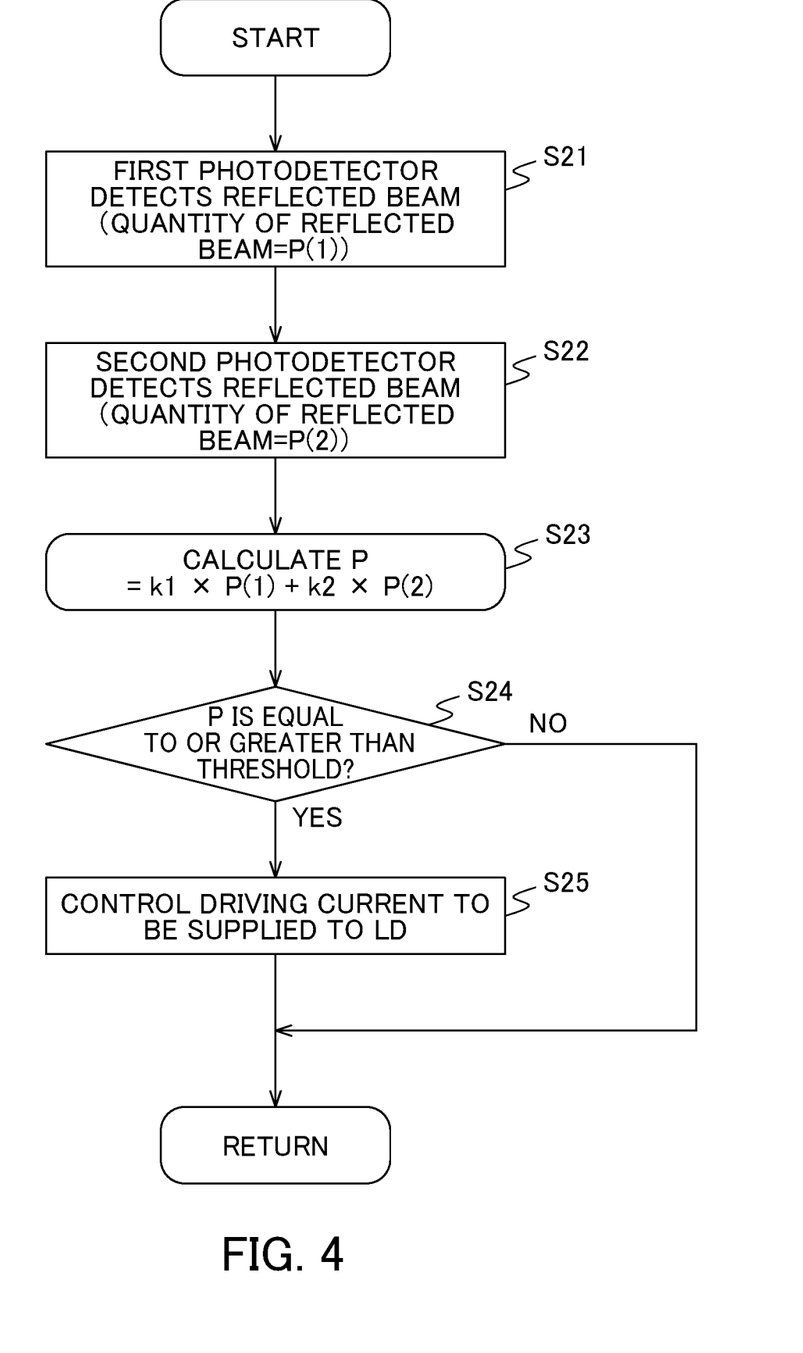
FIG. 4 is a flowchart showing the operation of a laser oscillator according to a second embodiment of the present invention.

In step S21, the first photodetector 160 detects the quantity of a reflected beam being part of a reflected beam from the work 50 and propagating mainly through the cladding of the optical fiber 100. The detected quantity of this reflected beam will be called P(1) below. Further, the first photodetector 160 transmits a first detection signal to the control unit 140 indicating the detected beam quantity.

In step S22, the second photodetector 170 detects the quantity of a reflected beam being part of the reflected beam from the work 50 and propagating mainly through the core of the optical fiber 100. The detected quantity of this reflected beam will be called P(2) below. Further, the second photodetector 170 transmits a second detection signal to the control unit 140 indicating the detected beam quantity.

In step S23, the control unit 140 calculates the quantity P of the entire reflected beam as follows by using P(1) and P(2) described above: $P = k_1 \times P(1) + k_2 \times P(2)$ ($k_1$ and $k_2$ are positive real numbers). The values of $k_1$ and $k_2$ may be determined in advance together with a threshold mentioned below based on a distribution of measured values of P(1), that of measured values of P(2), and information indicating a degree of actual damage to an optical unit, for example.

In step S24, the control unit 140 compares P with the threshold. If P is equal to or greater than the threshold (S21: YES), the control unit 140 proceeds to step S25. If P is less than the threshold (S24: NO), the control unit 140 returns to step S21 (RETURN) without taking any action.

In step S25, the control unit 140 controls the supply of the driving current to the laser diode 120 by the power supply unit 130. More specifically, the control unit 140 exerts feedback control over the supply of the driving current to the laser diode 120 so as to reduce the quantity of the reflected beam sufficiently for avoiding damage to an optical part in the laser diode 120. Then, the control unit 140 returns to step S21 (RETURN).

[Effect Achieved by Second Embodiment]

In the second embodiment, the total quantity of a reflected beam input to the optical fiber can be calculated. Further, by determining the threshold for the total quantity of the reflected beam, this threshold is allowed to have a margin, compared to a threshold determined for each quantity of a reflected beam.

Third Embodiment

Figure 5:
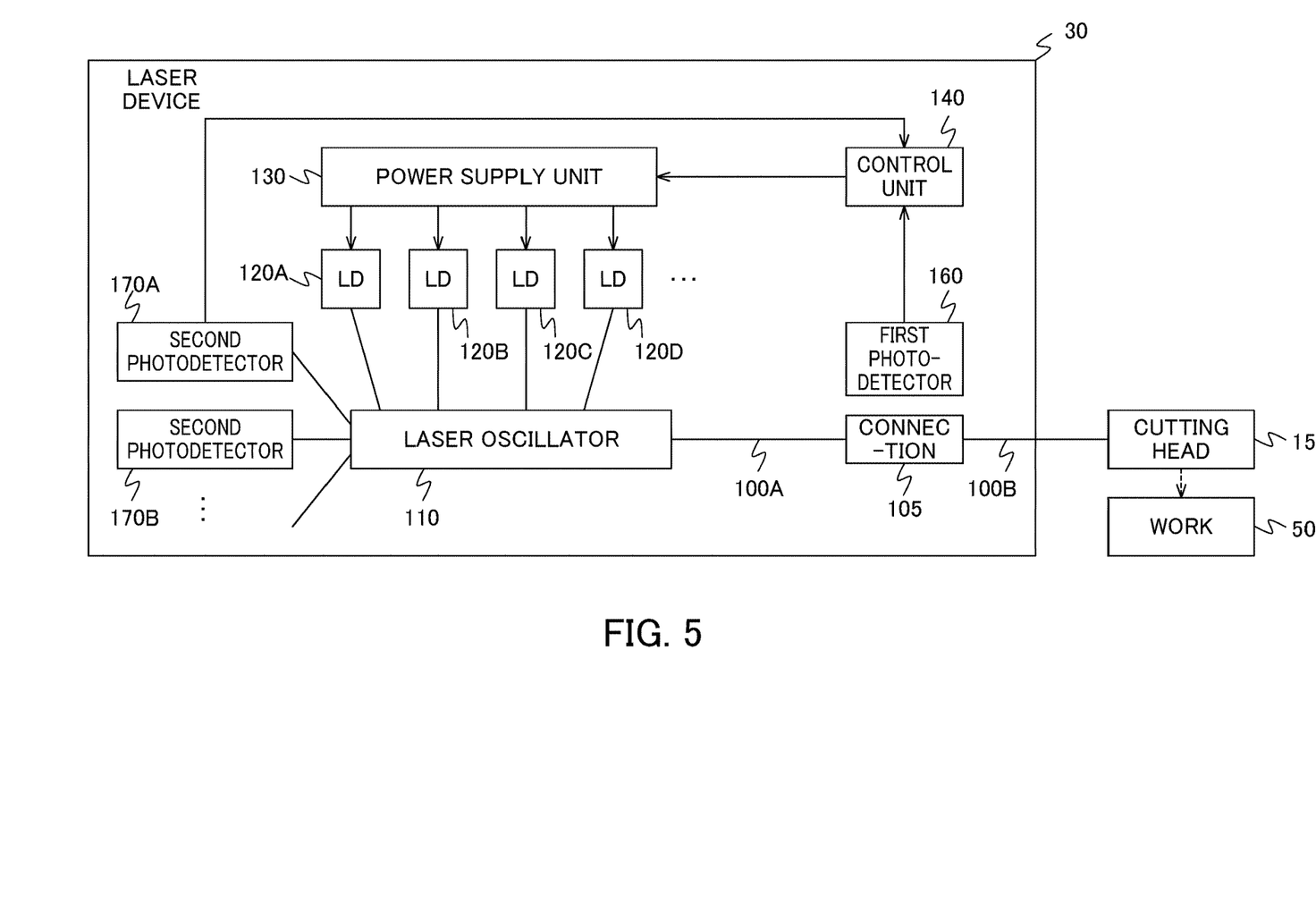
FIG. 5 shows the configuration of a laser device according to a third embodiment of the present invention.

FIG. 5 shows the configuration of a laser device 30 according to a third embodiment of the present invention. Components of the laser device 30 that are the same as those of the laser device 10 according to the first embodiment and those of the laser device 20 according to the second embodiment are identified by the same signs, and descriptions of such components will be omitted. Unlike in the laser device 10 and the laser device 20, in the laser device 30, the optical fiber 100 is divided into two optical fibers 100A and 100B, and the optical fibers 100A and 100B are fused at a connection 105. The first photodetector 160 is provided near the connection 105 and detects a beam leaking from the connection 105. The first photodetector 160 transmits a first detection signal to the control unit 140 indicating the quantity of the leaking beam.

Figure 3:
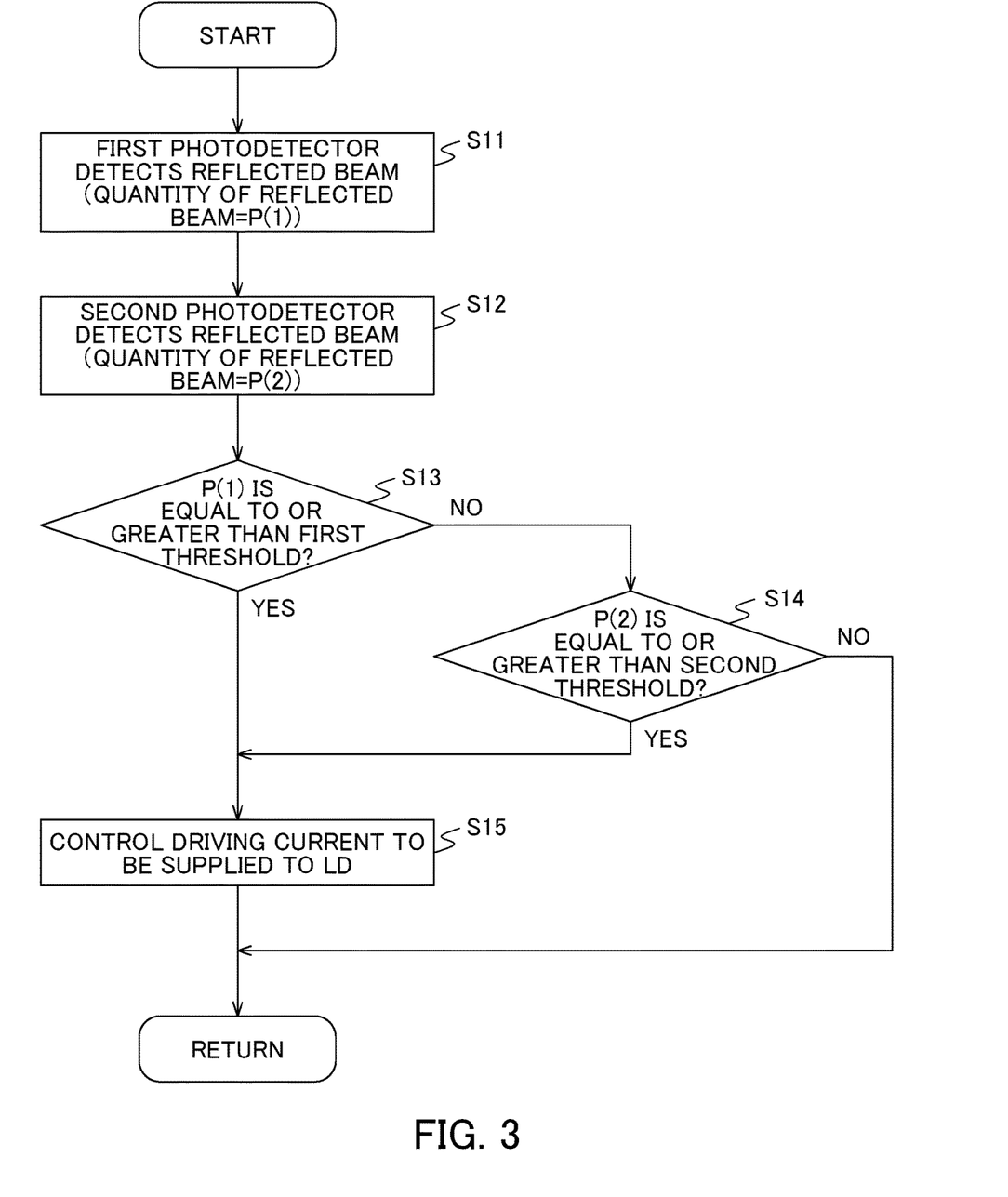
FIG. 3 is a flowchart showing the operation of the laser oscillator according to the first embodiment of the present invention.

The laser device 30 may operate by following the same flow as that of the flowchart of the laser device 10 shown in FIG. 3 or the same flow as that of the flowchart of the laser device 20 shown in FIG. 4. The operation of the laser device 30 will not be described in detail. The third embodiment differs from the first embodiment and the second embodiment in that, while the first photodetector 160 detects a reflected beam in step S11 in the flowchart of FIG. 3 and in step S21 in the flowchart of FIG. 4, the first photodetector 160 detects a beam leaking from the connection 105 in a corresponding step, as described above.

[Effect Achieved by Third Embodiment]

In the third embodiment, the quantity of a beam leaking from the connection 105 is large. Thus, the quantity of a reflected beam can be detected with a high degree of accuracy.

Other Embodiments

In particular, if a laser beam output oscillated by the laser oscillator 110 is large, a beam quantity detected by at least one of the first photodetector 160 and the second photodetector 170 includes a contribution by the quantity of a laser beam output in response to a beam output command from the control unit 140 and traveling in a forward direction substantially opposite to a direction in which a reflected beam travels. In this case, the control unit 140 may determine the quantity of the reflected beam by subtracting the contribution by the quantity of the laser beam traveling in the forward direction from a beam quantity detected by the first photodetector 160 and/or a beam quantity detected by the second photodetector 170. More specifically, by using the beam quantity P(1) detected by the first photodetector 160 as an example, the following relationship is established: P(1)=beam output Pf in forward direction+quantity Pr of reflected beam. When the control unit 140 gives a command to the power supply unit 130, the control unit 140 stores the beam quantity P(1) in advance detected by the first photodetector 160 as Pf, which is a quantity in the absence of a reflected beam. By doing so, in the presence of a reflected beam, the quantity Pr of the reflected beam can be calculated using the beam quantity P(1) detected by the first photodetector 160. By the use of the above-described configuration, even if a beam quantity detected by the photodetector includes a contribution by a laser beam traveling in a forward direction, the quantity of a reflected beam can still be detected accurately. Further, as one detector functions both as a reflected beam detector and an output beam detector, the configuration of the laser beam is simplified. This leads to increased reliability and cost reduction.

In the absence of a reflected beam from the work 50, actual beam output characteristics responsive to a beam output command from the control unit 140 and at least one of a beam quantity detected by the first photodetector 160 and a beam quantity detected by the second photodetector 170 may be measured by following a predetermined schedule. Resultant measurement data may be stored in the control unit 140 or a storage unit not shown in the drawings to be referenced by the control unit 140. Additionally, data stored in the control unit 140 or the storage unit may be updated using the measurement data. For the above-described calculation of the quantity Pr of a reflected beam, the control unit 140 may subtract a contribution by a laser beam traveling in a forward direction from a beam quantity detected by the first photodetector 160 and/or a beam quantity detected by the second photodetector 170 by using measurement data stored in the control unit 140 itself or in the storage unit. By doing so, the accuracy of the contribution by the laser beam traveling in the forward direction is maintained to ensure accurate detection of the quantity of the reflected beam.

At least one of the first photodetector 160 and the second photodetector 170 may be provided at the cutting head 15. By providing at least one of the first photodetector 160 and the second photodetector 170 at a position near an entrance of a reflected beam, damage to the laser device can be prevented more effectively.

The laser device may further include a photodetector temperature sensor that detects the temperature of at least one of the first photodetector 160 and the second photodetector 170. This achieves a correction of the dependence of the detection sensitivity of the photodetector on temperature so that the quantity of a reflected beam can be detected with a high degree of accuracy.

In the flowcharts of FIGS. 3 and 4, the quantity of a reflected beam is compared with the threshold and the driving current to be supplied to the laser diode 120 is controlled based on a result of the comparison with the threshold. In some cases, however, the quantity of the reflected beam being in excess of the set threshold does not cause damage to the laser oscillator if a period when the threshold is exceeded is extremely short. In this regard, if the period when the quantity of the reflected beam exceeds the threshold or the integral of the period when the threshold is exceeded becomes greater than a set period, the control unit 140 may exert feedback control by adjusting a command value to be given to the power supply unit 130 so as to reduce laser outputs indicated by P(1) and P(2).

In the flowcharts of FIGS. 3 and 4, the quantity of a reflected beam propagating mainly through the cladding, the quantity of a reflected beam propagating mainly through the core, and the total quantity of the reflected beam are each compared with a single threshold. Alternatively, each of these quantities may be compared with multiple thresholds. In this case, the control unit 140 may control the amount of supply of the driving current to the laser diode 120 based on a threshold reached by the quantity of a reflected beam.

If both or either the first photodetector 160 and/or the second photodetector 170 include multiple first photodetectors 160 and multiple second photodetectors 170, an alarm may be displayed if a difference in the detected quantity of a reflected beam between the first photodetectors 160 or between the second photodetectors 170 becomes greater than a predetermined value.

The present invention is not to be limited to the embodiments of the present invention described above. The effects described in these embodiments are merely a list of the most preferable effects resulting from the present invention. The effects achieved by the present invention are not to be limited to those described in these embodiments.

A laser control method implemented by each of the laser devices 10, 20, and 30 may be realized by software. To realize the laser control method by software, programs constituting this software are installed on a computer provided in each of the laser devices 10, 20, and 30. These programs may be stored in a removable medium and distributed to users. Alternatively, these programs may be distributed to the user by being downloaded onto a computer of the user through a network. Still alternatively, these programs may not be downloaded but may be offered to the computer of the user as a Web service through a network.

EXPLANATION OF REFERENCE NUMERALS 10 20 30 Laser device
50 Work
100 Optical fiber
120 Laser diode
130 Power supply unit
140 Control unit
160 First photodetector
170 Second photodetector

What is claimed is:

1. A laser device that outputs a laser beam by means of transmission through an optical fiber using a laser diode as a laser beam source or an excitation beam source, the laser device comprising:
 a laser oscillator;
 at least one first photodetector and at least one second photodetector, wherein
 when a reflected beam returns to the optical fiber of the laser device after being reflected off of a work;
  the first photodetector detects a first quantity of a first part of the reflected beam, the first part of the reflected beam being a part that propagates mainly through a cladding of the optical fiber; and the second photodetector detects a second quantity of a second part of the reflected beam, the second part of the reflected beam being a part that propagates mainly through a core of the optical fiber;

a power supplier that supplies a driving current to the laser diode; and a controller that controls the power supplier, wherein the second photodetector is located at a first end of the laser oscillator opposite a second end of the laser oscillator connected to the optical fiber, the controller is configured to control the power supplier in response to the first quantity of the first part of the reflected beam and the second quantity of the second part of the reflected beam detected by the first photodetector and the second photodetector, respectively, and the controller is further configured to, in a case that at least one of the first quantity of the first part of the reflected beam and the second quantity of the second part of the reflected beam includes a contribution by a third quantity of a laser beam output in response to a beam output command from the controller and traveling in a forward direction opposite to a direction in which the reflected beam travels, subtract the contribution by the third quantity from the at least one of the first quantity and the second quantity.

2. The laser device according to claim 1, wherein at least one predetermined threshold is set for at least one of the first quantity of the first part of the reflected beam detected by the first photodetector and the second quantity of the second part of the reflected beam detected by the second photodetector, and the controller is configured to:

in a case that at least one of the first quantity of the first part of the reflected beam detected by the first photodetector and the second quantity of the second part of the reflected beam detected by the second photodetector exceeds the corresponding predetermined threshold, control the driving current to be supplied from the power supplier to the laser diode, thereby changing a laser beam output from the laser device.

3. The laser device according to claim 1, wherein the controller is configured to perform a series of operations comprising:

detection of the first quantity of the first part of the reflected beam by the first photodetector, detection of the second quantity of the second part of the reflected beam by the second photodetector, a determination as to whether or not at least one of the first quantity and the second quantity exceeds a corresponding predetermined threshold, and change of a laser beam output from the laser device in response to excess of the at least one of the first quantity and the second quantity over the corresponding threshold, wherein the controller is configured to perform the series of operations at a time interval of 100 nsec to 10 msec.

4. The laser device according to claim 1, wherein the first photodetector is arranged so as to detect a beam leaking from the cladding of the optical fiber.

5. The laser device according to claim 4, wherein the first photodetector is provided near a connection formed of a fused part of the optical fiber.

6. The laser device according to claim 1, wherein the second photodetector is arranged at a terminal of each of multiple optical fibers resulting from branching of the optical fiber.

7. The laser device according to claim 1, wherein when a reflected beam does not return to the optical fiber of the laser device from the work, actual beam output characteristics responsive to a beam output command from the controller and at least one of the first quantity detected by the first photodetector and the second quantity detected by the second photodetector are measured by following a predetermined schedule, and the controller is configured to store the resultant measurement data in the controller or storage to be referenced by the controller, or the controller is configured to update measurement data stored in the controller or the storage using the resultant measurement data.

8. The laser device according to claim 1, wherein at least one of the first photodetector and the second photodetector is provided at a cutting head.

9. The laser device according to claim 1, wherein at least one of the first photodetector and the second photodetector is a photodiode.

10. The laser device according to claim 1, wherein at least one of the first photodetector and the second photodetector is a fiber temperature sensor.

11. The laser device according to claim 1, further comprising a photodetector temperature sensor that detects a temperature of at least one of the first photodetector and the second photodetector.

12. The laser device according to claim 1, wherein at least one of the first photodetector and the second photodetector includes multiple photodetectors, and the controller is configured to:

in a case that there is a first difference in the first quantity of the first part of the reflected beam between the multiple first photodetectors or a second difference in the second quantity of the second part of the reflected beam between the multiple second photodetectors, control the driving current to be supplied from the power supplier to the laser diode based on a maximum beam quantity.

13. The laser device according to claim 1, wherein the first photodetector transmits a first output to the controller indicating the first quantity of the reflected light beam, the second photodetector transmits a second output to the controller indicating the second quantity of the reflected light beam, and the controller controls the power supplier in response to the first output and the second output.

\* \* \* \* \*